United States Patent [19]

Toba et al.

[11] Patent Number: 4,781,943

[45] Date of Patent: Nov. 1, 1988

[54] PROCESS FOR PRETREATMENT BEFORE PLATING THROUGH-HOLES OF PRINTED CIRCUIT BOARDS

[75] Inventors: Ritsuji Toba; Tsunehumi Mutoo, both of Hadano, Japan

[73] Assignee: Hitachi, Ltd., Tokyo, Japan

[21] Appl. No.: 33,266

[22] Filed: Apr. 2, 1987

[30] Foreign Application Priority Data

Apr. 2, 1986 [JP] Japan .................................. 61-74209
Jun. 14, 1986 [JP] Japan ................................ 61-137291

[51] Int. Cl.$^4$ .............................................. B05D 5/12
[52] U.S. Cl. ........................................ 427/96; 427/97; 134/22.1; 134/31
[58] Field of Search ................... 427/97, 96; 134/22.1, 134/31

[56] References Cited

U.S. PATENT DOCUMENTS

| | | | |
|---|---|---|---|
| 3,755,890 | 9/1973 | Klehm | 427/97 |
| 4,155,775 | 5/1979 | Alpangh | 134/22.19 |
| 4,398,993 | 8/1983 | Hume | 156/902 |
| 4,544,439 | 10/1985 | Soloman | 134/21 |
| 4,639,380 | 1/1987 | Amelio | 427/97 |
| 4,668,532 | 5/1987 | Moisan | 427/98 |
| 4,701,352 | 10/1987 | DeLuca | 427/404 |

FOREIGN PATENT DOCUMENTS 53-46781 4/1978 Japan .
53-46782 4/1978 Japan .

OTHER PUBLICATIONS

Pridans et al., "Method for Through-Hole Plating Void Elimination" IBM TDB, vol. 21, No. 6, Nov. 1978, p. 2267.

Primary Examiner—Shrive Beck
Assistant Examiner—Vi Duong Dang
Attorney, Agent, or Firm—Antonelli, Terry & Wands

[57] ABSTRACT

A pretreatment process for removing air within through-holes of printed circuit boards before plating the through-holes is provided. Air within the through-holes of the printed circuit boards is replaced with a saturated vapor of a water-soluble liquid by dipping the printed circuit board into the boiled liquid and then the saturated vapor is dissolved in water or a water-soluble liquid to remove air.

27 Claims, No Drawings

PROCESS FOR PRETREATMENT BEFORE PLATING THROUGH-HOLES OF PRINTED CIRCUIT BOARDS

BACKGROUND OF THE INVENTION

This invention relates to a process for plating through-holes of a printed circuit board, more particularly to a process for pretreatment before plating the through-holes of a printed circuit board.

Printed circuit boards are provided with through-holes which connect one circuit to other circuits. Generally, a process for pretreatment before plating printed circuit board through-holes is predominantly composed of the steps of degreasing, washing, coarsening of copper film surfaces, washing, dipping in a sulphuric acid solution, washing, catalyzing, washing, accelerating and washing. After this pretreatment, electroless copper plating is carried out onto the through-holes. No step of removing air within the through-holes is included in the above-mentioned pretreatment process, but a surface active agent contained in a degreasing liquid used in the degreasing step reduces the surface tension of the liquid to improve the wettability of the liquid to the circuit boards. Furthermore, raising of a liquid temperature is also effective to some extent for removing air within the through-holes. In the case where a rack is used to convey and dip the circuit boards into a degreasing liquid in a greasing bath and the circuit boards on the rack are slightly impacted when the rack enters a rack receiver at the upper end of the bath, air may be removed from the through-holes. Therefore, any intended removal of air within through-holes of circuit boards having an aspect ratio (board thickness/through-hole diameter) of about 5 or less and hole diameter of 0.5 mm or more, is not carried out in the state of art.

However, printed circuits have recently been more highly densified, so such printed circuit boards have a smaller diameter of through-holes. In other words, the circuit boards tend to have a greater aspect ratio. In such case, air remaining within through-holes is difficult to remove completely. When electronic parts are mounted on the printed circuit boards and soldered, blow holes may be generated. The generation of the blow holes is mainly caused by gas ejected from the printed circuit boards to cause micro voids in the through-holes of the boards, which voids are not plated. Furthermore, there are various causes for the generation of the micro voids, but the most important cause is considered that air firmly adhered to the inner walls of the through-holes is not completely removed. The micro void-generating rate is about 0.01% or less per the number of through-holes. When one circuit board has as a great number of through-holes as about 35,000, the number of rejected circuit boards produced cannot be disregarded by any means.

Furthermore, circuit boards having an aspect ratio of about 5 or more and a hole diameter of about 0.5 mm or less have an undesirable area on which no copper is precipitated in a ring form substantially at the middle portion of a through-hole. This is referred to as a ring void. In case of using a chromium ion-containing sensitizing agent, the generation of the ring voids is caused by insufficient washing or using of improper compositions of the sensitizing agents or improper sensitizing conditions. The ring voids generated even when the proper compositions of sensitizing agent and proper sensitizing conditions are used are considered to be attributed to air remaining within the through-holes. That is, an increased aspect ratio causes a greater amount of air to remain in a form of bubbles within the through-holes, especially at the middle portion of the holes. Therefore, it is considered that the inner walls of the through-holes brought into contact with such air bubbles are not pretreated before plating, and accordingly copper is not precipitated on the such inner walls of the holes.

In order to avoid the generation of the ring voids, Japanese Patent KOKAI (Laid-Open) Nos. 46781/78 and 46782/78 proposed that circuit boards be subjected to low-frequency vibration or mechanical shock action. For example, they showed that the ring void-generation rate was about $5 \times 10^{-3}$% for a circuit board having a thickness of 3.8 mm and a hole diameter of 0.4 mm, when pretreated in an ordinary pretreatment manner but, on the other hand, the ring void-generation rate was reduced to $2 \times 10^{-5}$% when the same board was subjected to the proposed vibration or shock action. However, a great number of rejected boards were produced, where the board had a great number of through-holes. Thus, the proposal of the above-mentioned Japanese Patent KOKAI is not satisfactory.

SUMMARY OF THE INVENTION

It is an object of this invention to provide a pretreatment process for substantially completely removing air present within the through-holes of printed circuit boards.

In accordance with the first process of this invention, a printed circuit board is dipped into a boiling water-soluble liquid to purge air within the through-holes with the saturated vapor of the liquid, and then the board is dipped into water to dissolve the saturated vapor within the through-holes in the water.

In accordance with another process of this invention, a printed circuit board is dipped into a boiling water-soluble liquid to purge air within the through-holes with the saturated vapor of the liquid, and then the liquid is cooled to dissolve the saturated vapor in the liquid.

The pressure of air remaining within the through-holes is approximately equal to atmospheric pressure and, therefore, the saturated vapor of a water-soluble liquid enveloping the circuit board is expanded through the law of Dalton from the saturated vapor pressure to the atmospheric pressure, thereby penetrating into the through-holes to fill the through-holes with the saturated vapor. If the pressure of the saturated vapor is over the atmospheric pressure, air within the through-holes is almost completely purged with the saturated vapor. When such a board is dipped into water, the vapor within the holes is cooled to be condensed and dissolved in the water. Thus, the through-holes are filled with water. On the other hand, when the liquid is cooled as the board is held in the liquid, the vapor within the through-holes is condensed in liquid, thereby filling the through-holes with the liquid.

In the latter process of this invention, the circuit board is not required to be transferred from the vapor-treating bath to the cooling bath, because both the processes can be carried out in the same body of liquid. In such case, the substitution of air for the saturated vapor in the through-holes during the transferring can be avoided.

The printed circuit boards, from the through-holes of which air was thus removed, are subjected to the well-known plating pretreatment and then to an ordinary through-hole-plating treatment. The through-holes from which air was removed according to the process of this invention are filled with the liquid, which is not dropped from the holes and again replaced with air during the transferring of the board, as far as the circuit board is not dried in air or does not undergo mechanical shock in air. Thus, according to the process of this invention, the circuit boards can be subjected successively to the plating pretreatment and the plating treatment without allowing air to enter the through-holes. As a result, the process of this invention makes it possible to plate the through-holes of the printed circuit boards without generating the micro voids and ring voids.

DESCRIPTION OF THE PREFERRED EMBODIMENTS OF THE INVENTION

This invention will be explained in detail below with reference to some examples.

EXAMPLE 1

Holes of 0.3 mm in diameter were prepared in a board of 3 mm in thickness. For removing air from the holes, the board was dipped in boiling water for about 1 minute. The board was then pulled up from the boiling water and dipped into flowing water at 25° C. or lower before 15 seconds elapsed after the pulling-up, and it was held in the flowing water for about 1 minute. Thereafter, through-hole plating was carried out by using an electroless copper plating agent in the ordinary manner: degreasing - washing - conditioning - washing - soft etching - washing - dipping in 10% sulphuric acid solution - washing - predipping - sensitizing - washing - treatment with tight adhesion promotor - washing - electroless copper plating. Thus, 40,000,000 through-holes were plated. In this Example, the ring void-generation rate was $2.5 \times 10^{-6}$ or less. This means that the through-holes have no ring voids. On the other hand, through-holes from which air was not removed through the process of this invention had ring voids generated therein at the generation rate of $5 \times 10^{-3}\%$.

EXAMPLE 2

Non-penetrating holes of 0.5 mm in diameter and 2.5 mm in depth were prepared in a board of 3 mm in thickness. For removing air from the holes, the board was dipped in boiling ethyl alcohol for about 1 minute. After pulling up the board from the boiling alcohol, the board was dipped into flowing water at 25° C. or lower before 15 seconds elapsed after the pulling-up, and it was held in the flowing water for about 1 minute. Thereafter, the holes were plated by the ordinary manner using an electroless copper plating agent, as mentioned in Example 1. The bottoms of holes were totally plated through the process of this invention, whereas they were not plated at all when this invention was not applied.

EXAMPLE 3

Printed circuit boards of 3.8 mm in thickness having through-holes of 0.4 mm in diameter were dipped in boiling water for about 1 minute. Water at 20° to 25° C. was poured onto the circuit boards and the boiled water was cooled down to 80° C. or lower. The circuit boards were further dipped for about 1 minute in the cooled water. Thereafter, the through-holes were plated by the ordinary manner using a usual electroless copper plating agent.

In this Example, there were found no ring voids generated but through-holes from which air was not removed through the process of this invention had ring voids generated at a void-generation rate of $2 \times 10^{-5}\%$.

EXAMPLE 4

Printed circuit boards of 3.8 mm having through-holes of 0.4 mm in diameter were dipped in boiling ethyl alcohol for about 1 minute. The temperature of the ethyl alcohol was lowered to 40° C. or lower and further dipping was continued for about 1 minute therein. The through-holes were plated in the same manner as mentioned in Example 1.

In this Example, no ring voids were found.

In all the Examples above, water or ethyl alcohol was used as the water-soluble liquids, but all water-soluble liquids such as other alcohols, acetone, amines, esters and ketones, or mixtures thereof may be used.

The pretreatment conditions vary depending upon values of the aspect ratios, kinds of the water-soluble liquids, and liquid temperatures. That is, when the depth of the through-holes is h cm and the diameter of said holes is d cm, the aspect ratio D is h/d. When the temperature at which the saturated vapor of a water-soluble liquid is produced is $T_1°$ K., the pressure of a vapor, except for steam, is $P_1$ atm, and the steam pressure at $T_1°$ K. is $P_1°$ atm, the temperature of the cooled liquid is $T_2°$ K., and the steam pressure at $T_2°$ K. is $P_2°$ atm, the pretreatment conditions preferably satisfy the equation:

$$(\tfrac{3}{2}) \times T_1(1-P_2°)/T_2(1-P°-P_1) > h/d = D.$$

According to the process of this invention, air within through-holes can be completely removed before electroless plating and, therefore, the through-holes as pretreated by the process of this invention and then plated have no micro voids or ring voids therein.

What is claimed is:

1. A process for pretreatment before plating holes of printed circuit boards, which comprises dipping said printed circuit boards into a boiling water-soluble liquid to purge air within the holes with a saturated vapor of said liquid, and then dipping said printed circuit boards into water, thereby dissolving said saturated vapor within said holes in the water.

2. The process according to claim 1, wherein said holes are prepared in said printed circuit boards and thereafter said printed circuit boards are dipped into said boiling liquid.

3. The process according to claim 1, wherein said saturated vapor within said holes is dissolved in water and thereafter said printed circuit boards are subjected to a degreasing step.

4. The process according to claim 1, wherein said printed circuit boards have an aspect ratio of about 5 or more.

5. The process accrding to claim 1, wherein said water-soluble liquid is at least one liquid selected from the group consisting of water, an alcohol, an amine, an ester, and a ketone.

6. The process according to claim 1, wherein said liquid is water.

7. The process according to claim 1, wherein said liquid is ethyl alcohol.

8. The process according to claim 1, wherein the step of dipping said printed circuit boards into water comprises dipping said printed circuit boards into flowing water having a temperature of 25° C. or less.

9. The process according to claim 1, wherein said holes are through-holes.

10. The process according to claim 1, wherein said holes are non-penetrating holes.

11. A process for pretreatment before plating holes of printed circuit boards, which comprises dipping said printed circuit boards into a boiling water-soluble liquid to purge air within the holes with a saturated vapor of said liquid, and then cooling said liquid to dissolve said saturated vapor within said holes in said liquid.

12. The process according to claim 11, wherein said holes are prepared in said printed circuit boards and thereafter said printed circuit boards are dipped into said boiling liquid.

13. The process according to claim 11, wherein said saturated vapor is dissolved in said liquid and thereafter said printed circuit boards are subjected to the degreasing step.

14. The process according to claim 11, wherein said printed circuit boards have an aspect ratio of about 5 or more.

15. The process according to claim 11, wherein said water-soluble liquid is at least one liquid selected from the group consisting of water, an alcohol, an amine, an ester, and a ketone.

16. The process according to claim 15, wherein said liquid is ethyl alcohol.

17. The process according to claim 16, wherein the step of cooling said liquid comprises cooling said liquid to a temperature of 40° C. or less.

18. The process according to claim 11, wherein said liquid is water.

19. The process according to claim 18, wherein the step of cooling said liquid comprises pouring water at a temperature of 20°–25° C. into said liquid.

20. The process according to claim 11, wherein said holes are through-holes.

21. The process according to claim 11, wherein said holes are non-penetrating holes.

22. In a process of plating holes of a printed circuit board, comprising:
    degreasing said printed circuit board;
    washing said printed circuit board;
    conditioning said printed circuit board;
    washing said printed circuit board;
    soft etching said printed circuit board;
    washing said printed circuit board;
    dipping said printed circuit board in a 10% sulfuric acid solution;
    washing said printed circuit board;
    predipping said printed circuit board;
    sensitizing said printed circuit board;
    treating said printed circuit board with a tight adhesion promotor;
    washing said printed circuit board; and
    plating said printed board;
    wherein the improvement comprises pretreating said holes by,
    dipping said printed circuit board in a boiling water-soluble liquid to purge air in said holes with a saturated vapor of said liquid; and
    dipping said printed circuit board in water, to dissolve said saturated vapor within said holes.

23. A process according to claim 22, wherein said holes are through-holes.

24. A process according to claim 22, wherein said holes are non-penetrating holes.

25. In a process of plating holes of a printed circuit board, comprising:
    degreasing said printed circuit board;
    washing said printed circuit board;
    conditioning said printed circuit board;
    washing said printed circuit board;
    soft etching said printed circuit board;
    dipping said printed circuit board in a 10% sulfuric acid solution;
    washing said printed circuit board;
    predipping said printed circuit board;
    sensitizing said printed circuit board;
    washing said printed circuit board;
    treating said printed circuit board with a tight adhesion promotor;
    washing said printed circuit board; and
    plating said printed circuit board;
    wherein said improvement comprises pretreating said holes by,
    dipping said printed circuit board in a boiling water-soluble liquid to purge air in said holes with a saturated vapor of said liquid; and
    cooling said liquid to dissolve said saturated vapor within said holes.

26. A process according to claim 25, wherein said holes are through-holes.

27. A process according to claim 25, wherein said holes are non-penetrating holes.

* * * * *